US009929177B2

United States Patent
Nagumo

(10) Patent No.: US 9,929,177 B2
(45) Date of Patent: Mar. 27, 2018

(54) SEMICONDUCTOR MEMORY DEVICE AND METHOD FOR MANUFACTURING SAME

(71) Applicant: TOSHIBA MEMORY CORPORATION, Minato-ku (JP)

(72) Inventor: Toshiharu Nagumo, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 15/404,420

(22) Filed: Jan. 12, 2017

(65) Prior Publication Data

US 2017/0309638 A1 Oct. 26, 2017

Related U.S. Application Data

(60) Provisional application No. 62/327,157, filed on Apr. 25, 2016.

(51) Int. Cl.
| | |
|---|---|
| *H01L 29/792* | (2006.01) |
| *H01L 21/336* | (2006.01) |
| *H01L 27/11582* | (2017.01) |
| *H01L 29/423* | (2006.01) |
| *H01L 23/528* | (2006.01) |
| *H01L 27/11519* | (2017.01) |
| *H01L 27/11556* | (2017.01) |
| *H01L 27/11565* | (2017.01) |

(52) U.S. Cl.
CPC .... *H01L 27/11582* (2013.01); *H01L 23/5283* (2013.01); *H01L 27/11519* (2013.01); *H01L 27/11556* (2013.01); *H01L 27/11565* (2013.01); *H01L 29/4234* (2013.01)

(58) Field of Classification Search
CPC ............ H01L 27/11582; H01L 29/4234
USPC .......................... 257/324; 438/264
See application file for complete search history.

(56) References Cited

U.S. PATENT DOCUMENTS

| 8,482,055 | B2 | 7/2013 | Choi et al. |
| 8,803,215 | B2 | 8/2014 | Kim |
| 9,006,817 | B2 | 4/2015 | Choi |
| 9,324,732 | B2 * | 4/2016 | Oh .................... H01L 27/11582 |
| 2010/0314678 | A1 | 12/2010 | Lim et al. |
| 2011/0169072 | A1 | 7/2011 | Lim et al. |
| 2012/0068255 | A1 | 3/2012 | Lee et al. |
| 2012/0205722 | A1 | 8/2012 | Lee et al. |
| 2012/0273867 | A1 * | 11/2012 | Ko ...................... H01L 29/7926 257/324 |

(Continued)

OTHER PUBLICATIONS

Frank Engel Rasmussen, et al., "Fabrication of High Aspect Ratio Through-Wafer Vias in CMOS Wafers for 3-D Packaging Applications" DTU Library, Technical University of Denmark, IEEE 3E123.P, 2003, pp. 1659-1662 and cover page.

*Primary Examiner* — David Vu
*Assistant Examiner* — Brandon Fox
(74) *Attorney, Agent, or Firm* — Oblon, McClelland, Maier & Neustadt, L.L.P.

(57) ABSTRACT

A semiconductor memory device includes a first semiconductor layer; a stacked body including a plurality of electrode layers stacked in a first direction; a metal layer provided in the first direction between the first semiconductor layer and the stacked body; a second semiconductor layer extending in the first direction through the stacked body and the metal layer, and being electrically connected to the first semiconductor layer.

18 Claims, 14 Drawing Sheets

(56) References Cited

U.S. PATENT DOCUMENTS

2015/0200199 A1* 7/2015 Sakamoto .......... G11C 16/0408
                                                          257/329
2015/0221666 A1   8/2015 Lee
2015/0279851 A1  10/2015 Fan et al.
2016/0190155 A1*  6/2016 Lee .................. H01L 27/11582
                                                          438/268
2017/0125538 A1*  5/2017 Sharangpani ..... H01L 21/28556

* cited by examiner

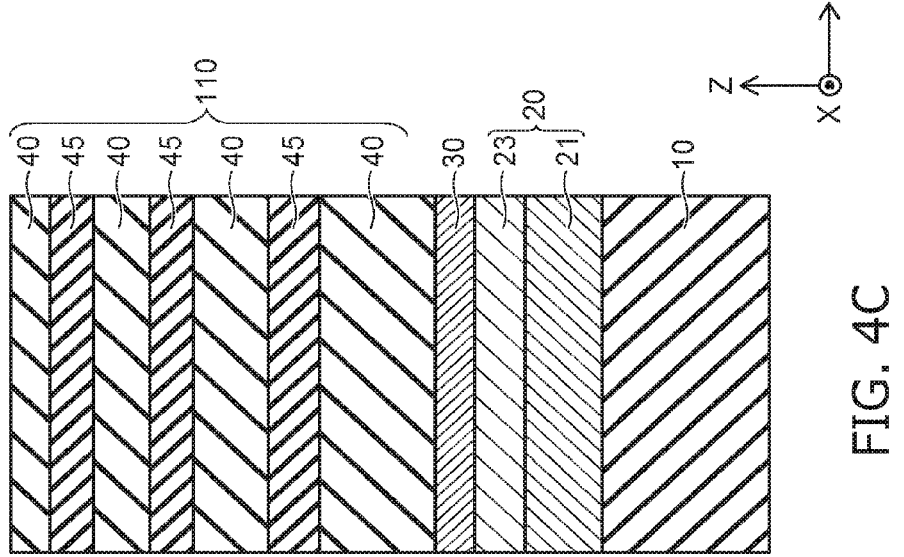
FIG. 4A
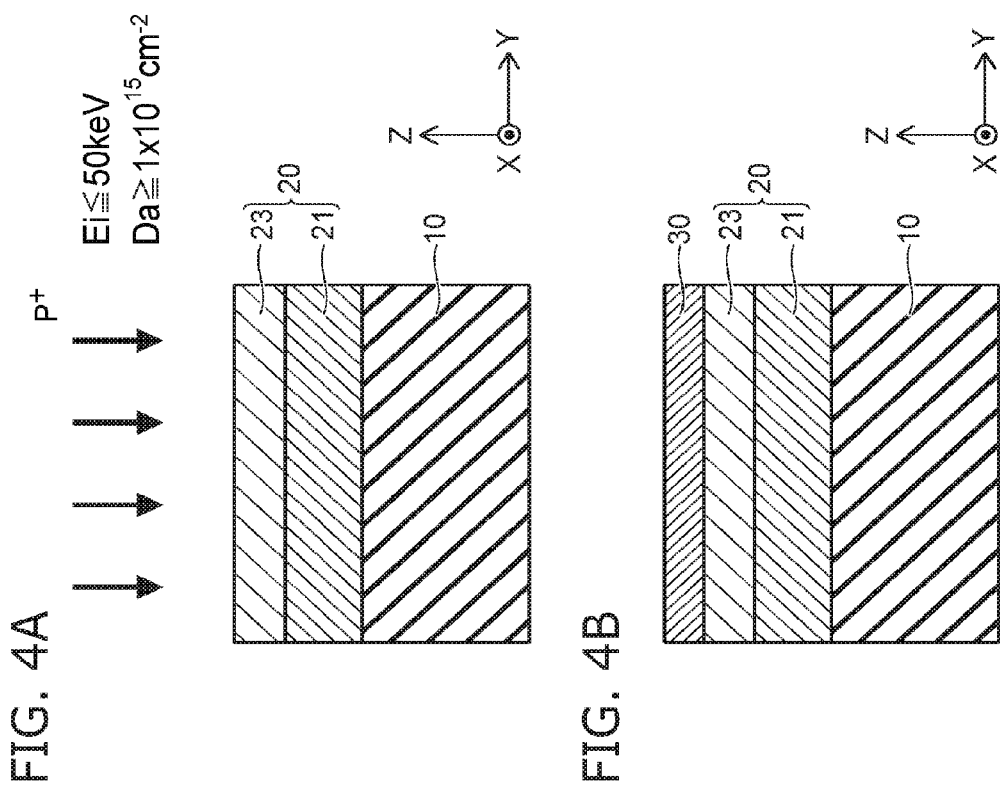
FIG. 4B
FIG. 4C

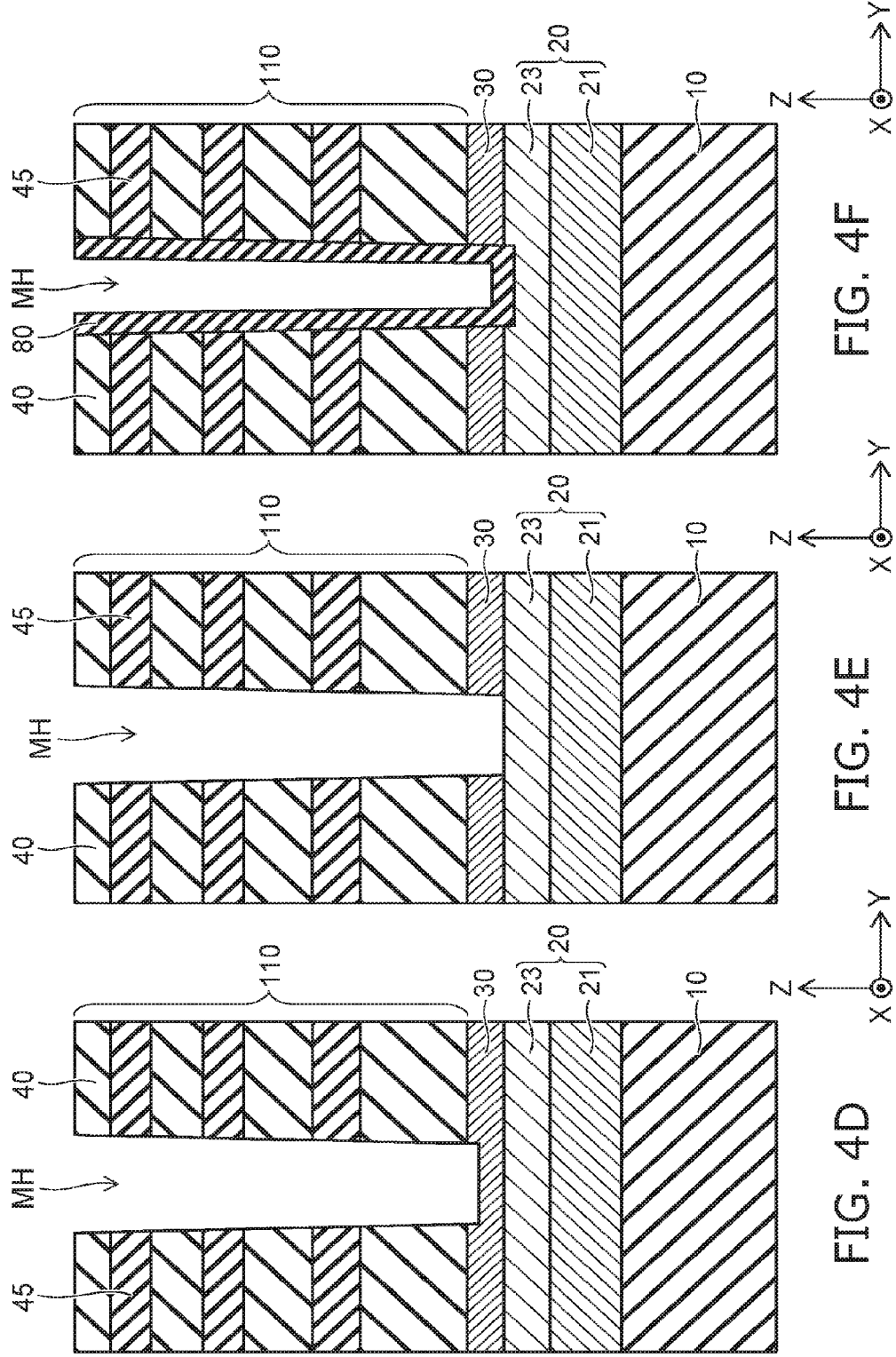

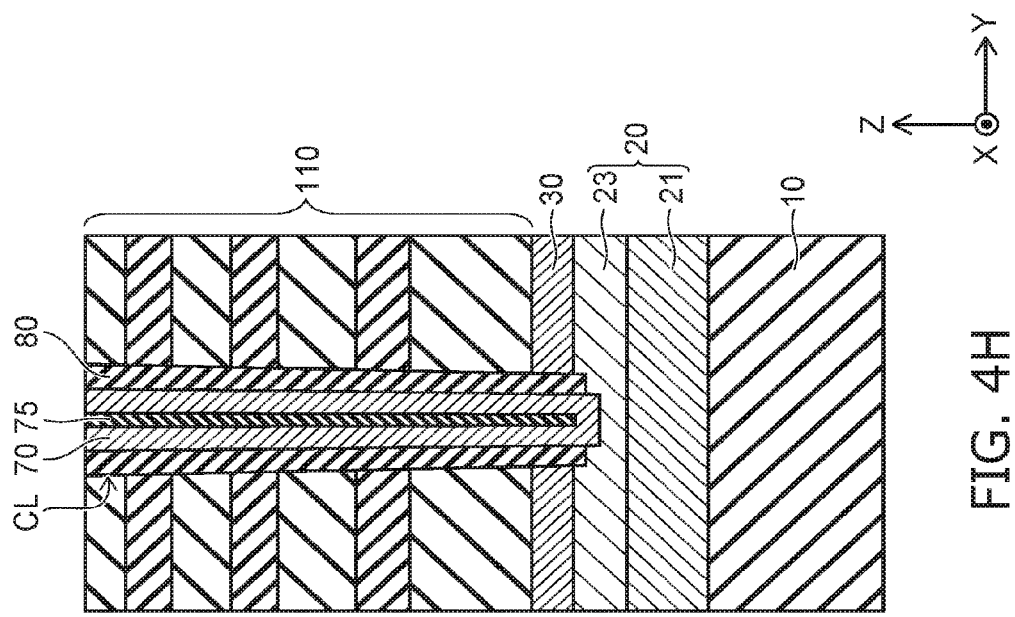
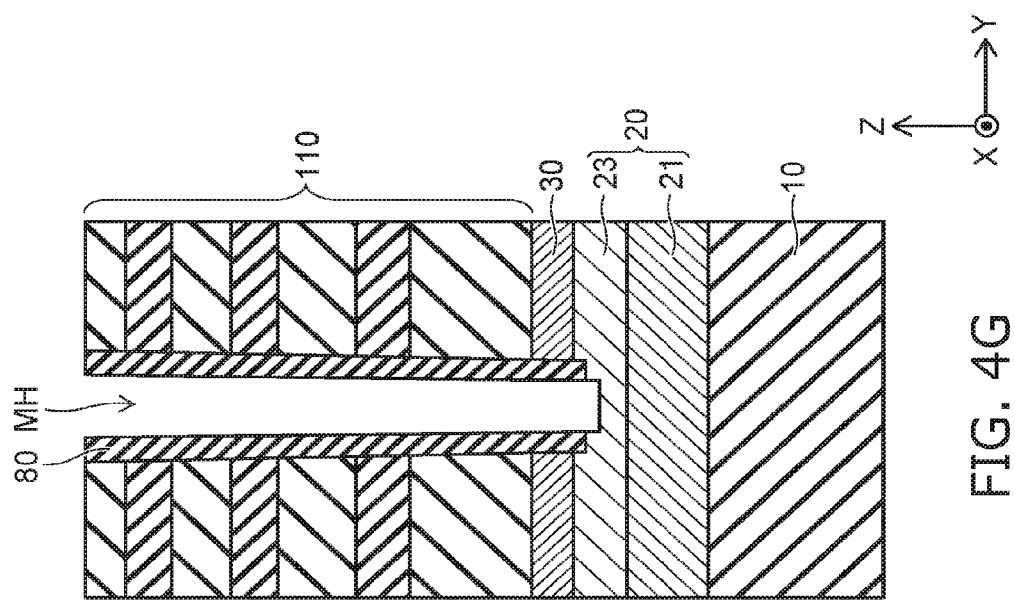

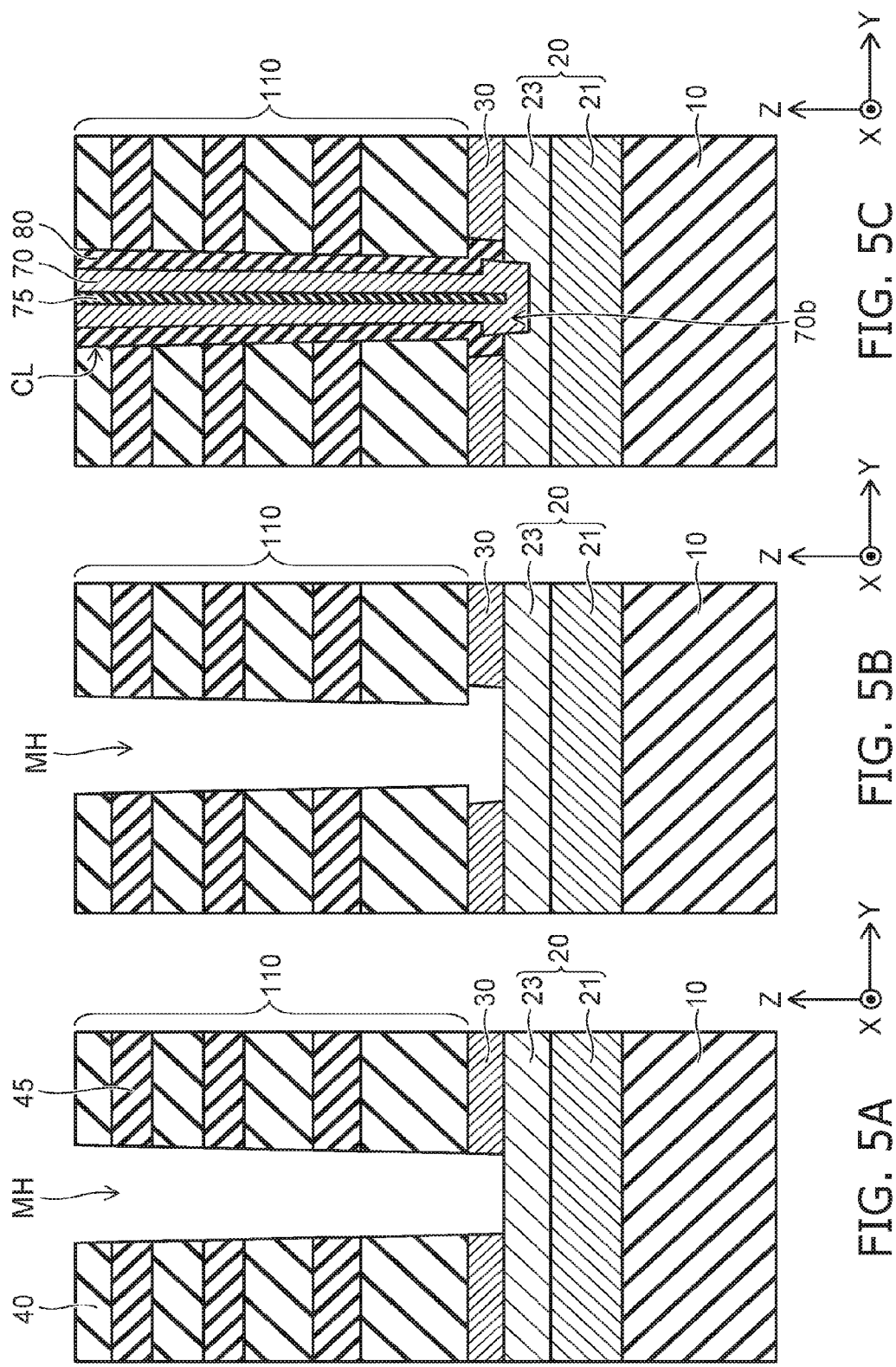

SEMICONDUCTOR MEMORY DEVICE AND METHOD FOR MANUFACTURING SAME

CROSS-REFERENCE TO RELATED APPLICATIONS

This application is based upon and claims the benefit of priority from U.S. Provisional Patent Application 62/327,157 filed on Apr. 25, 2016; the entire contents of which are incorporated herein by reference.

FIELD

Embodiments are generally related to a semiconductor memory device and a method for manufacturing the same.

BACKGROUND

A semiconductor memory device of three-dimensional structure is under developing, which includes a charge storage layer and a semiconductor layer provided in a memory hole. The memory hole is formed in a stacked body that includes a plurality of electrode layers stacked on a conductive layer, and the charge storage layer and the semiconductor layer extend in a stacked direction of the plurality of electrode layer. In the manufacturing process of such a memory device, the memory hole is formed from a top surface to be in communication with the conductive layer.

BRIEF DESCRIPTION OF THE DRAWINGS

FIGS. 4A to 4M are schematic cross-sectional views showing a manufacturing process of the semiconductor memory device according to the embodiment;

FIGS. 5A to 5C are schematic cross-sectional views showing a manufacturing process according to a variation of the embodiment.

DETAILED DESCRIPTION

Figure 1:
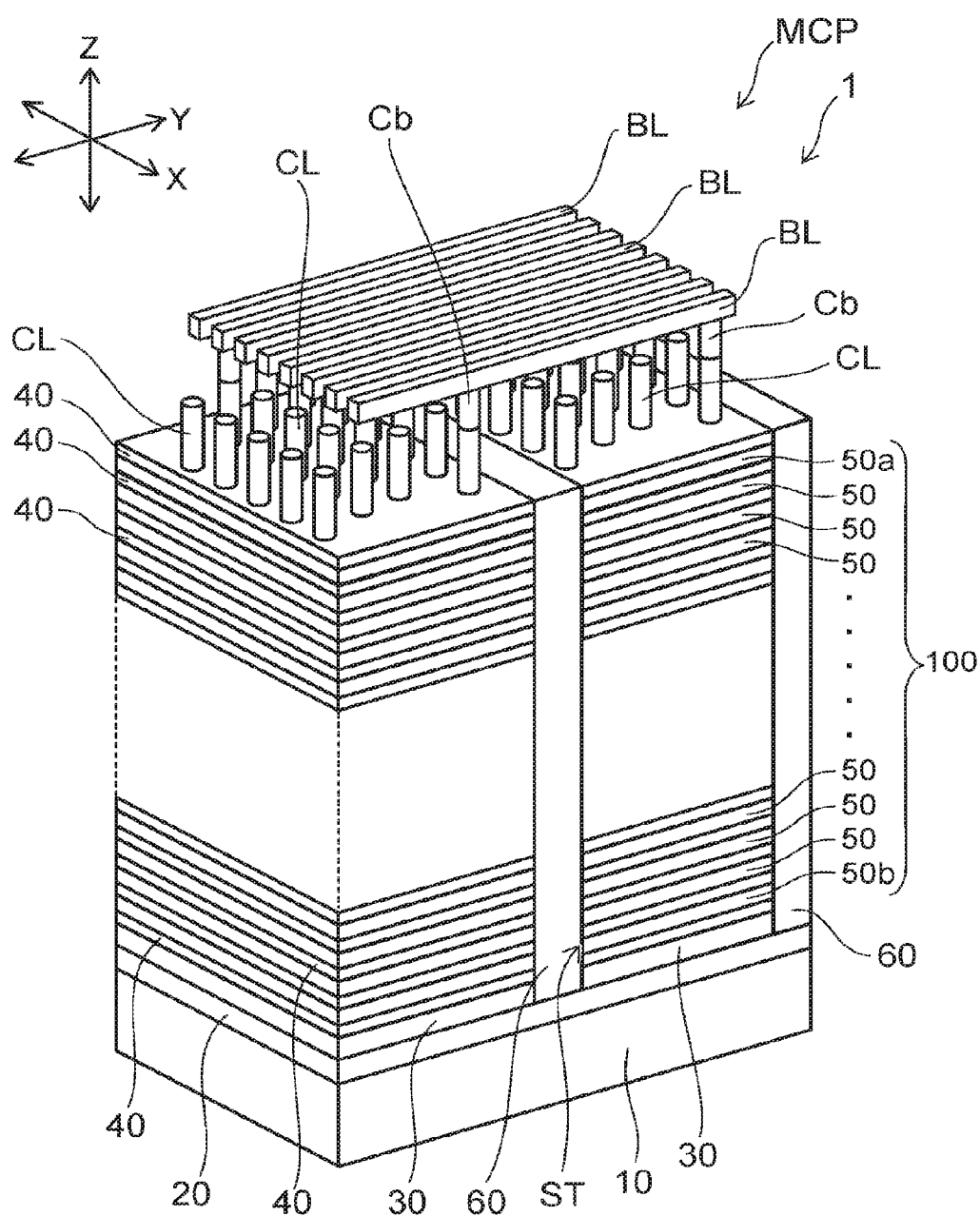
FIG. 1 is a perspective view showing a memory cell part of a semiconductor memory device according to an embodiment.

According to one embodiment, a semiconductor memory device includes a first semiconductor layer; a stacked body including a plurality of electrode layers stacked in a first direction; a metal layer provided in the first direction between the first semiconductor layer and the stacked body; a second semiconductor layer extending in the first direction through the stacked body and the metal layer, and being electrically connected to the first semiconductor layer.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

A semiconductor memory device according to an embodiment is, for example, a NAND type nonvolatile memory device, and includes a memory cell part MCP that includes three-dimensionally disposed memory cells. FIG. 1 is a perspective view showing the memory cell part MCP of a semiconductor memory device 1. It should be noted in FIG. 1 that an insulating layer provided between a stacked body 100 and bit lines BL is omitted.

The memory cell part MCP shown in FIG. 1 includes the stacked body 100 and columnar bodies CL. The stacked body 100 is provided on a substrate (not shown) with an insulating layer 10 and a source layer 20 interposed, and the columnar bodies CL extends in the Z-direction through the stacked body 100. The stacked body 100 includes a plurality of electrode layers 50 stacked in the Z-direction. An insulating layer 40 is provided between electrode layers 50 that are adjacent to each other in the Z-direction. An electrode layer 50 acts as a control gate of memory cell, i.e. a word line. Moreover, in the embodiment, a metal layer 30 is provided between the source layer 20 and a stacked body 100.

As shown in FIG. 1, stacked bodies 100 are arranged in the Y-direction on the source layer 20. An insulating layer 60 is provided between the stacked bodies 100 which are adjacent to each other. A columnar body CL includes a semiconductor layer 70, and the semiconductor layer 70 is electrically connected to a bit line BL via a contact plug Cb. Moreover, the semiconductor layer 70 is electrically connected to the source layer 20 (see FIG. 2A).

Figure 2A:
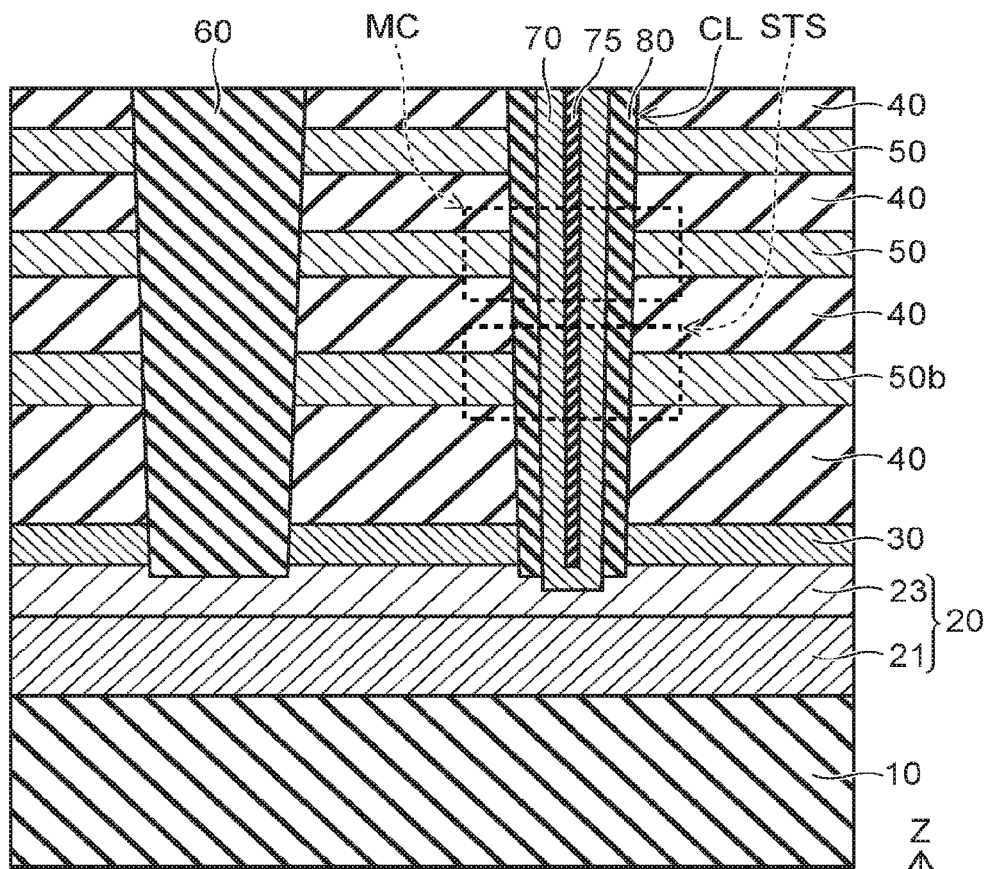
FIGS. 2A and 2B are schematic cross-sectional views showing the memory cell part of the semiconductor memory device according to the embodiment.
Figure 2B:
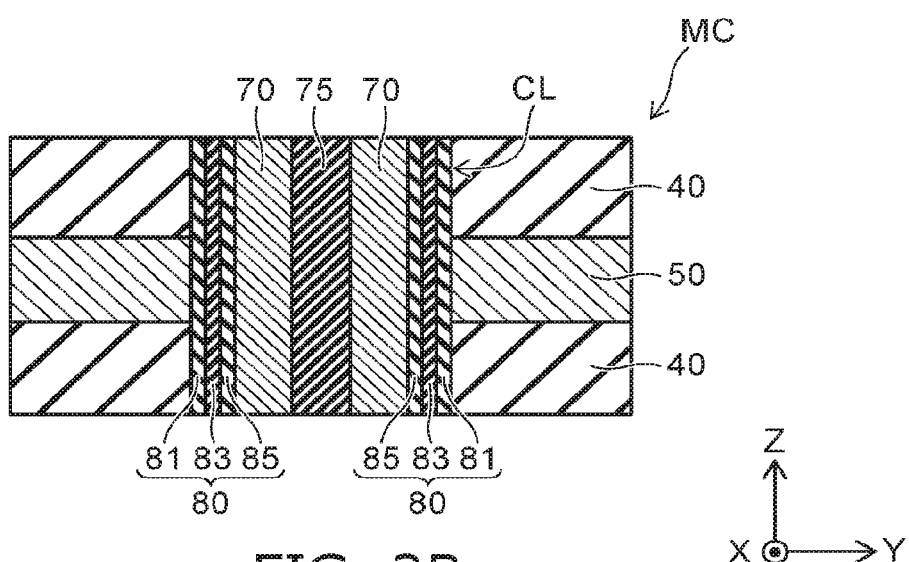

Hereinafter, a structure of the memory cell part MCP is described in detail with reference to FIGS. 2A and 2B. FIG. 2A is a schematic cross-sectional view of the memory cell part MCP taken along the Y-Z plane. FIG. 2B is a schematic cross-sectional view showing a memory cell MC shown in FIG. 2A.

As shown in FIG. 2A, the source layer 20 is provided on the insulating layer 10. The source layer 20 is, for example, an N-type semiconductor layer, and includes a first portion 21 and a second portion 23. The first portion 21 is positioned between the insulating layer 10 and the second layer 23. The first portion 21 is, for example, an N-type amorphous silicon layer. The second portion 23 is, for example, an N-type amorphous silicon layer which includes N-type impurities of higher concentration than that in the first portion 21.

The metal layer 30, for example, is provided to be in contact with the second portion 23. A contact resistance between the source layer 20 and the metal layer 30 is smaller as the concentration of N-type impurities becomes higher in the second portion 23. Thus, the concentration of N-type impurities in the second portion 23, for example, is desirable to be not less than $1 \times 10^{20}$ cm$^{-3}$.

It should be noted that the source layer 20 is not limited to the example described above. The source layer 20 may be a semiconductor layer, for example, that uniformly includes N-type impurities. The source layer 20 may be, for example, a P-type semiconductor layer. In such a case, the second portion 23 includes P-type impurities of higher concentration than that in the first portion 21. Moreover, the source layer 20 may be, for example, a polycrystalline silicon layer. The second portion 23 may includes a material different from a material of the first portion 21. When the first portion 21 includes, for example, polycrystalline silicon, the second portion 23 may includes silicon-germanium (SiGe).

The metal layer 30 includes high-melting-point metal such as tungsten, tantalum and like. Alternatively, the metal layer 30 may include metal compound such as tungsten nitride (WN), tungsten silicide (WSi) and like.

As shown in FIG. 2A, the columnar body CL is provided to extend in the Z-direction through the metal layer 30, the insulating layers 40 and the electrode layers 50. The insulating layer 60 is provided between the adjacent stacked bodies 100, and divides the metal layer 30.

The columnar body CL includes a semiconductor layer 70, a core body 75 and an insulating layer 80. The core body 75 is, for example, a silicon oxide, and extends in the Z-direction through the columnar body CL. The semiconductor layer 70 extends in the Z-direction. The semiconductor layer 70 is, for example, an amorphous silicon layer, and is provided so as to surround the core body 75 (see FIG. 6B). The insulating layer is provided so as to surround a periphery of the semiconductor layer 70 (see FIG. 6B). That is, the semiconductor layer 70 is positioned between the core body 75 and the insulating layer 80.

As shown in FIG. 2A, a selection transistor STS on a source side is provided at a part where the columnar body CL extends through an electrode layer 50b. The electrode layer 50b is the lowermost layer of the electrode layers 50 included in the stacked body 100. The semiconductor layer 70 acts as a channel of the selection transistor STS, and the electrode layer 50b acts as a selection gate on the source side. The insulating layer 80 acts as a gate insulating layer of the selection transistor STS at a part positioned between the electrode layer 50b and the semiconductor layer 70.

A selection transistor STD on a drain side (not shown) is provided at a part where the columnar body CL extends through an electrode layer 50a (see FIG. 1). The electrode layer 50a is the uppermost layer of the electrode layers 50. The electrode layer 50a acts as a selection gate on the drain side. Then, the memory cells MC are provided at parts where the columnar body CL extends through electrode layers 50 positioned between the electrode layer 50a and the electrode layer 50b.

As shown in FIG. 2B, the insulating layer 80 includes, for example, a first layer 81, a second layer 82 and a third layer 83. The first layer 81, the second layer 83 and the third layer 85 each extend along the semiconductor layer 70 in the Z-direction. The second layer 83 is positioned between the first layer 81 and the third layer 85. The first layer 81 is positioned between the electrode layers 50 and the second layer 83. The third layer 85 is positioned between the semiconductor layer 70 and the second layer 83. The first layer 81 and the third layer 85 are, for example, silicon oxide layers, and the second layer 83 is, for example, a silicon nitride layer.

The insulating layer 80 includes charge storage portions positioned between the electrode layers 50 and the semiconductor layer 70. For example, electric charges are injected into the insulating layer 80 from the semiconductor layer 70 by a bias voltage applied between an electrode layer 50 and the semiconductor layer 70. Then, the electric charges injected are trapped at interface states between the first layer 81 and the second layer 83 or at interface states between the second layer 83 and the third layer 85. Moreover, the electric charges trapped in these interface states are released into the semiconductor layer 70 by a reverse bias voltage applied between the electrode layer 50 and the semiconductor layer 70. Thus, data writing in a memory cell MC and data erasing from the memory cell MC are performed in this manner. Differently from the example described above, the insulating layer 80 may include conductors at the portions between the electrode layers 50 and the semiconductor layer 70 such that the conductors acts as floating gates.

Figure 3A:
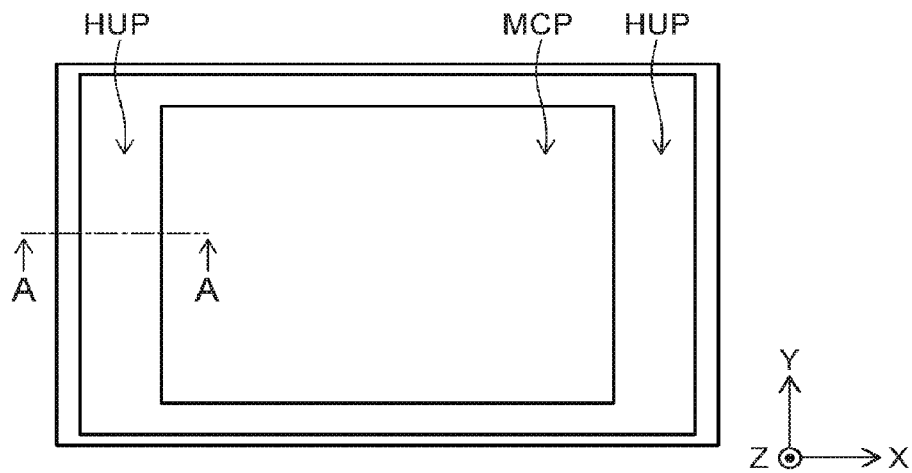
FIGS. 3A and 3B are schematic views showing a hook-up part of the semiconductor memory device according to the embodiment.
Figure 3B:
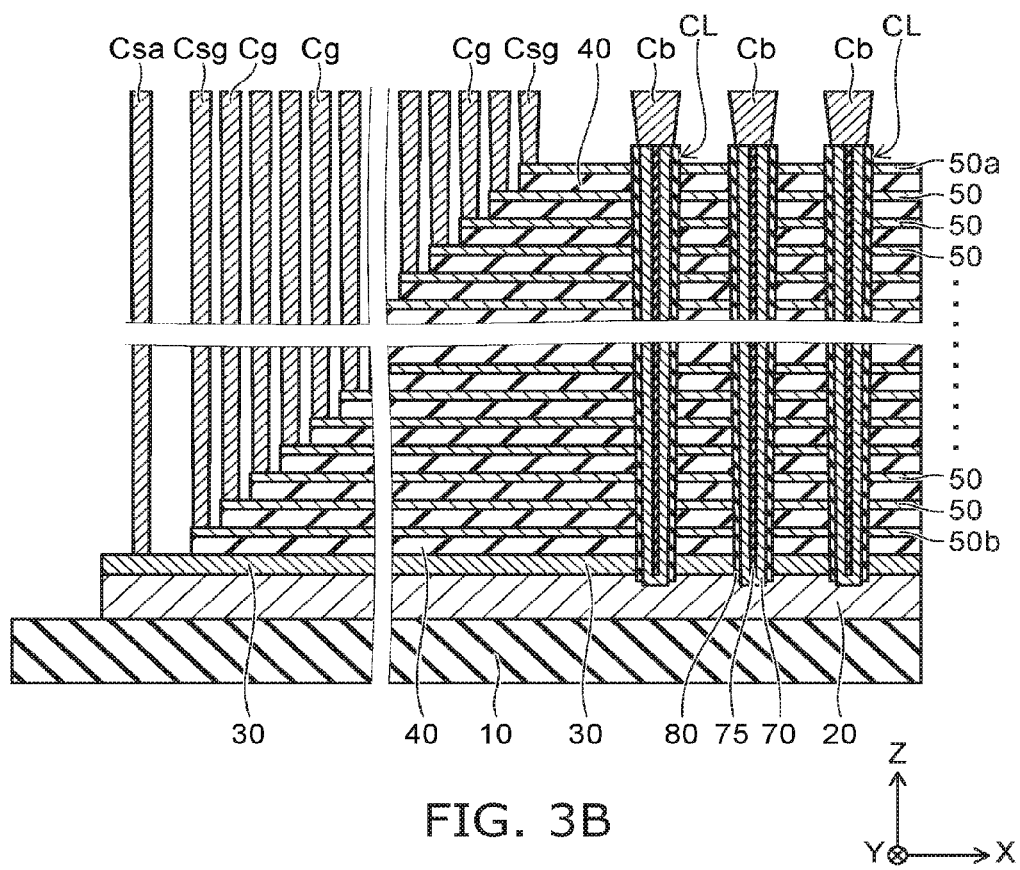

FIGS. 3A and 3B are schematic views showing the hook-up part HUP of the semiconductor memory device 1. The hook-up part HUP has a structure that hooks up each of the plurality of electrode layers 50 stacked in the Z-direction so as to be electrically connected to a driving circuit (not shown).

FIG. 3A is a plan view schematically showing an arrangement of memory cell array. As shown in FIG. 3A, the hook-up part is provided on each side of the memory cell part MCP in the X-direction.

FIG. 3B is a cross-sectional view taken along A-A line shown in FIG. 3A. As shown in FIG. 3B, a plurality of columnar bodies CL are provided in the memory cell part MCP, and each include a semiconductor layer 70 which is electrically connected to a bit line BL via a contact plug Cb. A plurality of contact plugs Cg and Csg are provided in the hook-up part HUP. End portions of the electrode layers 50, which locate in the hook-up part HUP, are formed into stairs respectively. The end portions of the electrode layers 50 are arranged so as not to be overlapped in the Z-direction from each other. Thus, it is possible to electrically connect the contact plugs Cg and Csg to the end portions of the electrode layers 50 respectively.

As shown in FIG. 3B, the contact plug Cg is electrically connected to each electrode layer 50 (a word line). The contact plug Csg is electrically connected to the electrode layer 50a or 50b (a selection gate). A contact plug Csa is further provided at a position farthest from the memory cell part MCP in the hook-up part HUP, and is electrically connected to a metal layer 30. For example, a contact plug Csg, which is electrically connected to the electrode layer 50b (the selection gate on the source side), is positioned between the contact plug Cg and the contact plug Csa.

The contact plugs Cg and Csg electrically connect gate interconnections (not shown) and the electrode layers 50 respectively. The contact plug Csa electrically connects the source layer 20 and the source line SL1 (see FIG. 6C).

In the embodiment, the metal layer 30 is provided between the source layer 20 and the stacked body 100, and reduces a spreading resistance of the source layer 20. Thereby, it is possible to provide the contact plug Csa at a position far from the memory cell part MCP. That is, by reducing the spreading resistance of the source layer 20, it is possible to reduce differences in bias voltages applied to semiconductor layers 70 in the columnar bodies CL respectively via the source line SL1, the contact plug Csa and the source layer 20.

Figure 6A:
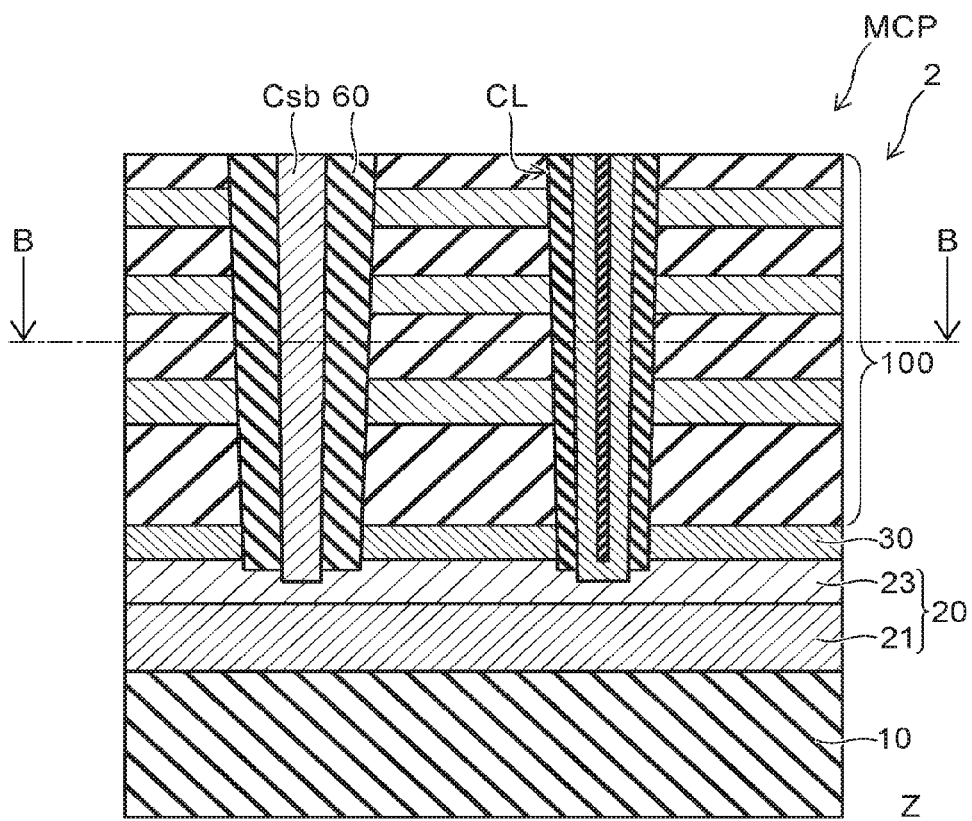
FIGS. 6A to 6C are schematic views showing a semiconductor memory device according to a variation of the embodiment.

When the metal layer 30 is not provided, for example, it is desirable to provide a contact plug Csb in the insulating layer 60 as shown in FIG. 6A. Thereby, it is possible to reduce differences in bias voltages applied to semiconductor layers 70 respectively by reducing a distance between each semiconductor layer 70 and the contact plug Csb. In such a structure, however, a distance is widened between stacked bodies 100 being adjacent to each other. Thus, the number of memory cells disposed in the memory cell part MCP is reduced, and a reduction of memory capacity may be raised.

In contrast, it is possible in the embodiment to enlarge the memory capacity by providing the contact plug Csa at the outside of the memory cell part MCP and reducing the distance between the stacked bodies 100 being adjacent to each other.

Hereinafter, a manufacturing method of the semiconductor memory device 1 according to the embodiment is described with reference to FIGS. 4A to 4M. FIGS. 4A to 4M are schematic cross-sectional views showing a manufacturing process of the semiconductor memory device 1.

As shown in FIG. 4A, phosphorus (P), which is an N-type impurity, is ion-implanted into a top side of the source layer 20. The source layer 20 is formed, for example, on a substrate (not shown) with an insulating layer 10 interposed. The insulating layer 10 is, for example, a silicon oxide layer formed using TEOS-CVD (Chemical Vapor Deposition). The source layer 20 is, for example, an amorphous silicon layer formed using CVD. Phosphorus (P), which is an N-type impurity, is doped, for example, in the source layer 20.

Then, the N-type impurities (P) are ion-implanted, for example, under a condition of implant energy Ei not more than 50 keV and a dose amount Da not less than $1.0 \times 10^{15}$ $cm^{-2}$. The N-type impurities are implanted in the vicinity of a front surface of the source layer 20, and form a first portion 21 and a second portion 23 in the source layer 20. The second portion 23 is positioned on the top surface side of the source layer 20, and includes N-type impurities of higher concentration than that in the first portion 21. It should be noted that there is a case where the amorphous silicon is crystallized and converted to polycrystalline silicon through a process of thermal treatment for activating the ion-implanted N-type impurities.

As shown in FIG. 4B, a metal layer 30 is formed on the source layer 20. The metal layer 30 includes, for example, a high-melting-point metal such as tungsten formed using CVD. The metal layer 30 is formed, for example, directly on the second portion 23 which includes N-type impurities with a concentration not less than $1 \times 10^{20}$ $cm^{-3}$. Thereby, a contact resistance is reduced between the source layer 20 and the metal layer 30.

As shown in FIG. 4C, a stacked body 110 is formed on the metal layer 30. The stacked body 110 includes, for example, insulating layers 40 and 45 alternately stacked in the Z-direction. The insulating layers 40 are, for example, silicon oxide layers formed using CVD. The insulating layers 45 are, for example, silicon nitride layers formed using CVD. Materials used for the insulating layers 45 are selectively removed with respect to the insulating layers 40 under a prescribed etching condition.

As shown in FIG. 4D, a memory hole MH is formed from a top surface of the stacked body 110 to the metal layer 30. The memory hole MH is formed by selectively removing the insulating layers 40 and 45, for example, using RIE (Reactive Ion Etching). The memory hole MH is formed, for example, under an etching condition where an etching rate of the metal layer 30 is slower than etching rates of the insulating layers 40 and 45. That is, the metal layer 30 acts as an etching stopper layer.

As shown in FIG. 4E, the source layer 20 is exposed at a bottom surface of the memory hole MH by selectively removing the metal layer 30. It is desirable to remove the metal layer 30 under an etching condition where the source layer 20 is not removed or is removed with a faster rate than an etching rate of the source layer 20. The metal layer 30 is removed, for example, using wet etching or isotropic dry etching.

As shown in FIG. 4F, an insulating layer 80 is formed to cover an inner surface of the memory hole MH. The insulating layer 80 is formed, for example, using CVD on the inner surface of the memory hole MH. The insulating layer 80 has a structure, for example, in which a silicon oxide layer, a silicon nitride layer and another silicon oxide layer are stacked in order.

As shown in FIG. 4G, a part of the insulating layer 80 is selectively removed, which is formed on the bottom surface of the memory hole MH. The part of the insulating layer 80 is removed, for example, using anisotropic RIE.

As shown in FIG. 4H, a semiconductor layer 70 is formed to cover the inner surface of the memory hole MH. The semiconductor layer 70 is, for example, an amorphous silicon layer formed using CVD. The semiconductor layer 70 covers the insulating layer 80 formed on an inner wall of the memory hole MH, and is electrically connected to the source layer 20 at the bottom surface of the memory hole MH. A core body 75 is further formed so as to be embedded in the memory hole MH. The core body 75 includes, for example, silicon oxide formed using CVD.

Figure 4I:
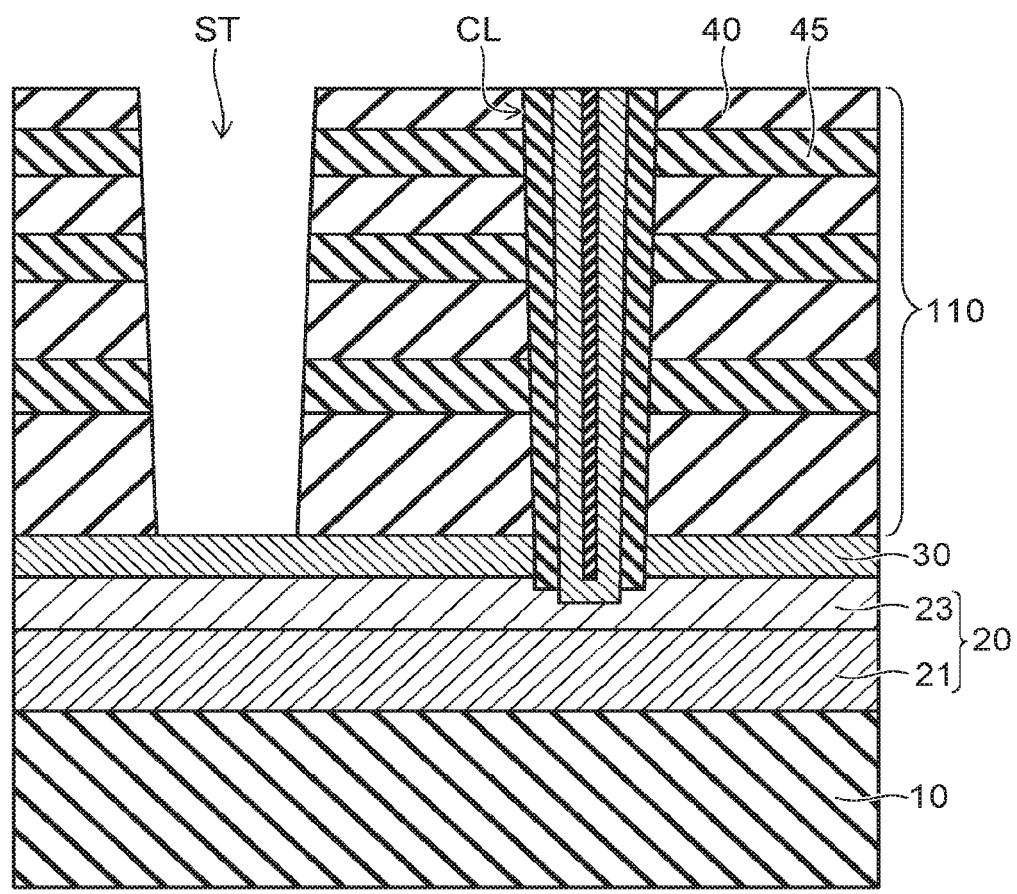

As shown in FIG. 4I, a slit space ST is formed, which divides the stacked body 110 into a plurality of parts. The slit space ST is formed, for example, using anisotropic RIE from the top surface of the stacked body 110 with a depth capable of reaching the metal layer 30. The slit space ST extends in the X-direction, and divides the stacked body 110 into the parts each formed to be a stacked body 100. The metal layer 30 also acts as an etching stopper layer while forming the slit space ST.

Figure 4J:
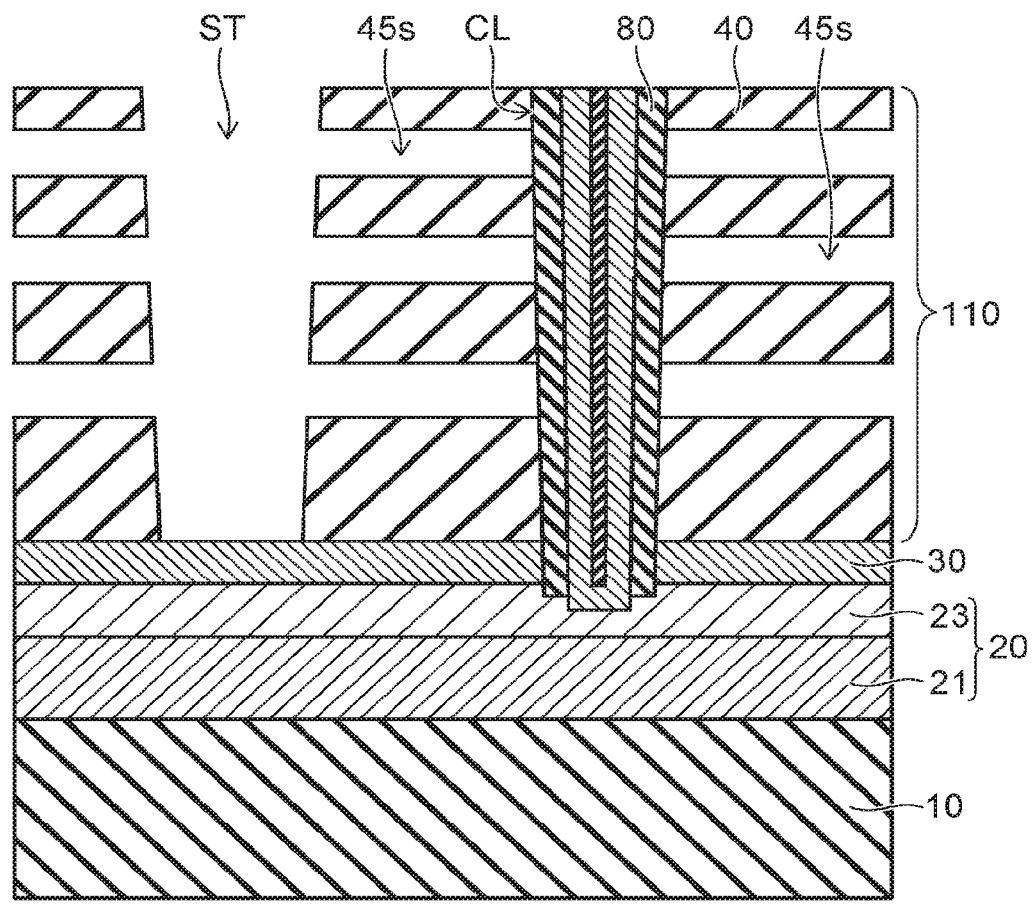

As shown in FIG. 4J, the insulating layers 45 are selectively removed through the slit space ST. The insulating layers 45 are selectively etched, for example, by supplying etching liquid through the slit space ST. When the insulating layers 45 are silicon nitride layers, and the insulating layers 40 are silicon oxide layers, it is possible to selectively remove the insulating layers 45 using hot phosphoric acid as the etching liquid, and leave the insulating layers 40. It should be noted that a material used for the metal layer 30 has resistivity against the etching solution.

Figure 4K:
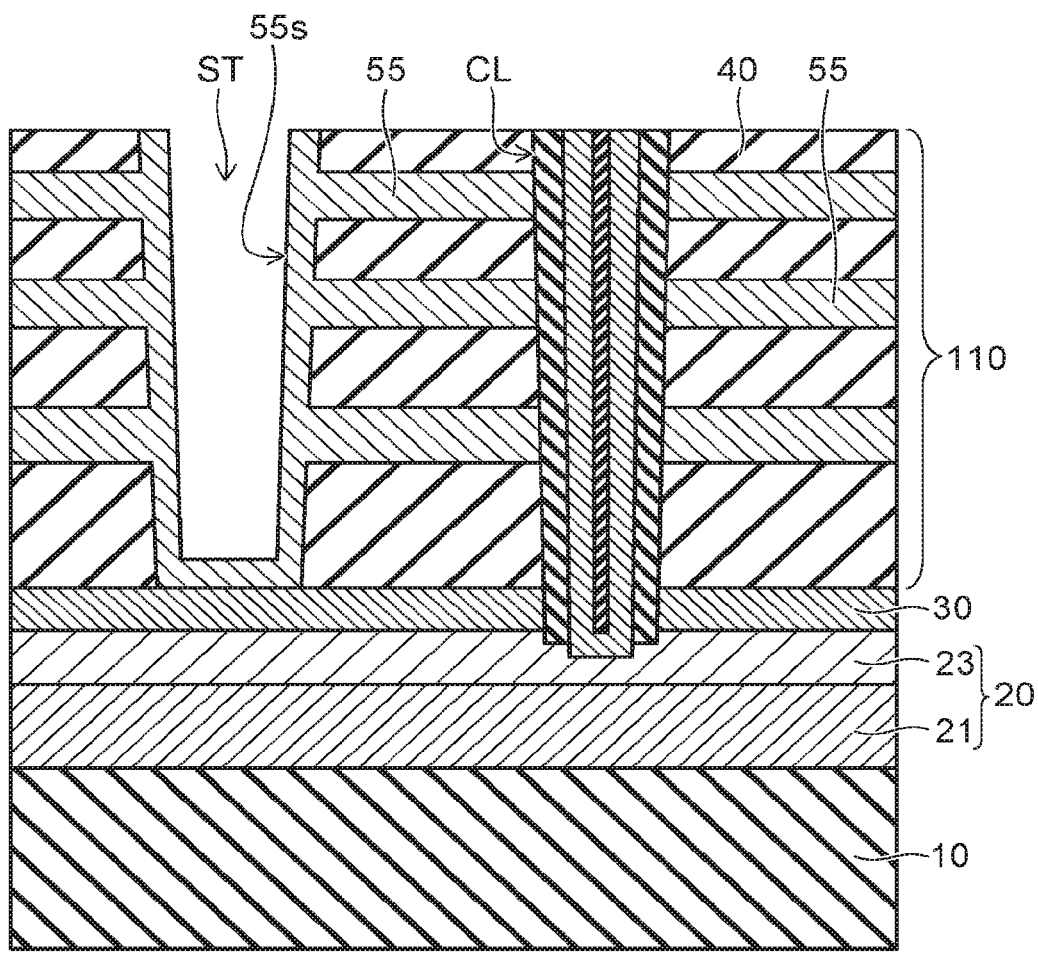

As shown in FIG. 4K, a metal layer 55 is formed in spaces 45s which are formed by removing the insulating layers 45. The metal layer 55 is, for example, a tungsten layer formed using CVD. Source gases of CVD are supplied through the silt space ST.

Figure 4L:
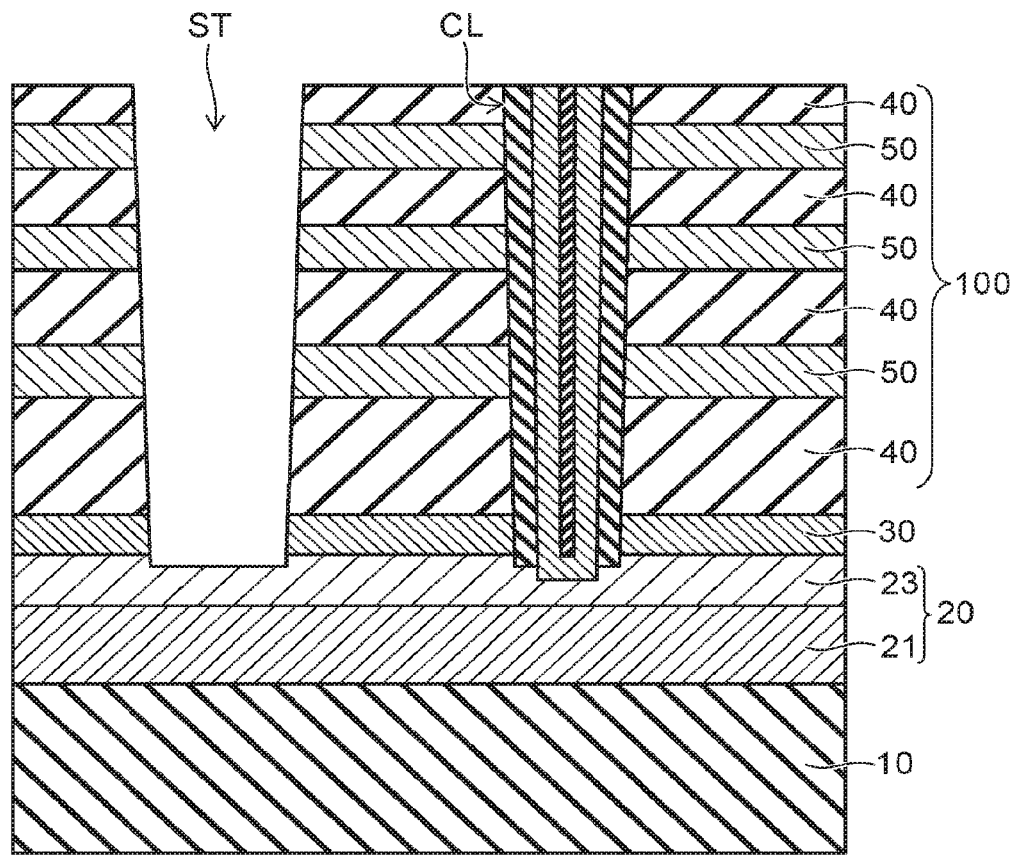

As shown in FIG. 4L, electrode layers 50 are formed by removing a part of the metal layer 55 which covers an inner surface of the slit space ST. Thereby, the stacked body 100 (see FIG. 1) is completed, which includes the plurality of electrode layers 50. In this process, it is also possible to expose the source layer 20 at the bottom surface of the slit space ST by selectively removing the metal layer 30. Electrode layers 50, which are adjacent to each other in the Z-direction, are electrically isolated by one of the insulating layers 40.

Figure 4M:
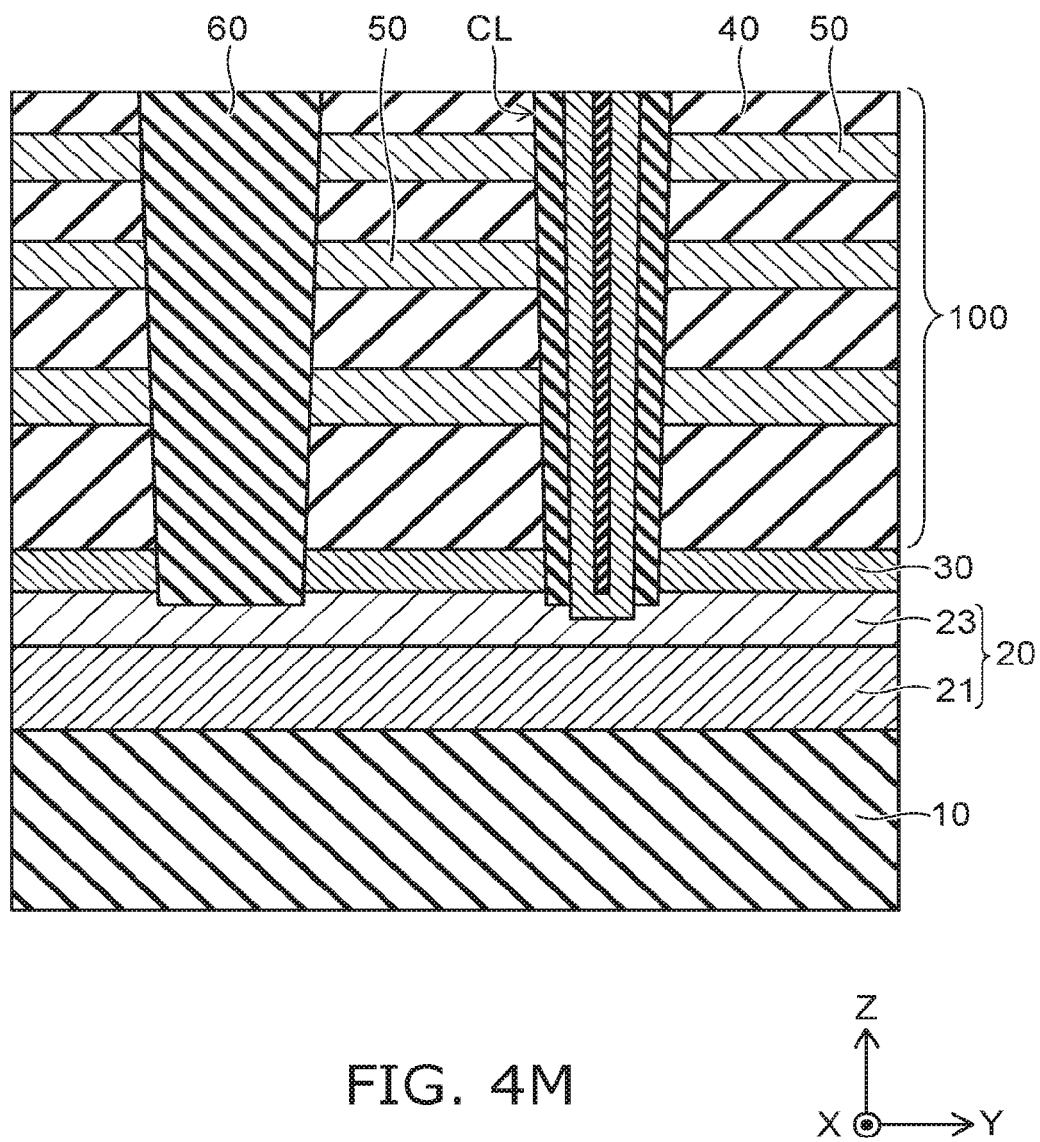

As shown in FIG. 4M, an insulating layer 60 is formed in the slit space ST. The insulating layer 60 is, for example, a silicon oxide layer formed using CVD, and electrically isolates the stacked bodies 100 which are adjacent to each other in the Y-direction (see FIG. 1). Moreover, the memory cell part MCP is completed by forming bit lines BL over the stacked bodies 100 via an interlayer insulating layer (not shown).

In the manufacturing method described above, the metal layer 30 acts as the etching stopper layer through the formation process of the memory hole MH and the formation process of the slit space ST. Then, it is possible to improve depth controllability of the memory hole MH and the slit space ST. Thus, it becomes possible to reduce an etching amount of the source layer 20, and to form the source layer 20 with a thin thickness. Thereby, reducing manufacturing cost and load on the manufacturing equipment used for forming the source layer 20 can be achieved.

Hereinbelow, a manufacturing method of the semiconductor memory device 1 according to a variation of the embodiment is described with reference to FIGS. 5A to 5C. FIGS. 5A to 5C are schematic cross-sectional views showing a manufacturing process, for example, following FIG. 4E.

As shown in FIG. 5A, the metal layer 30 is selectively removed via the memory hole MH, and the source layer 20 is exposed at the bottom surface thereof. Also in this example, the source layer 20 includes the first portion 21 and the second portion 23, and a surface of the second portion 23 is exposed at the bottom surface of the memory hole MH.

As shown in FIG. 5B, a bottom portion of the memory hole MH is widened in a direction along a surface of the source layer 20 (the X-direction and the Y-direction) by further etching the metal layer 30. Thereby, a surface of the source layer 20 exposed at the bottom surface of the memory hole MH is widened. The etching of the metal layer 30 is performed, for example, using isotropic dry etching under a condition where an etching rate thereof is faster than an etching rate of the source layer 20.

As shown in FIG. 5C, the semiconductor layer 70, the core body 75 and the insulating layer 80 are formed in the memory hole MH. In this process, the manufacturing method shown in FIG. 4F to 4H is used, for example. In this example, as the bottom portion of the memory hole MH is widened, it is possible to enlarge a bottom portion 70b of the semiconductor layer 70 in the X-direction and the Y-direction. Thereby, a contact area between the source layer 20 and the semiconductor layer 70 is widened, and thus, it is possible to reduce the contact resistance between the source layer and the semiconductor layer 70.

Figure 6B:
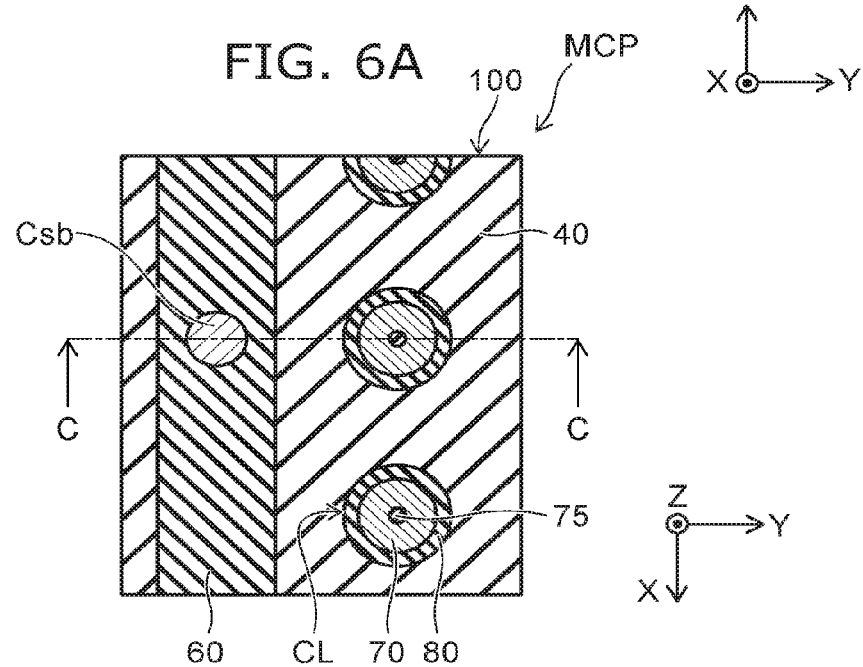
Figure 6C:
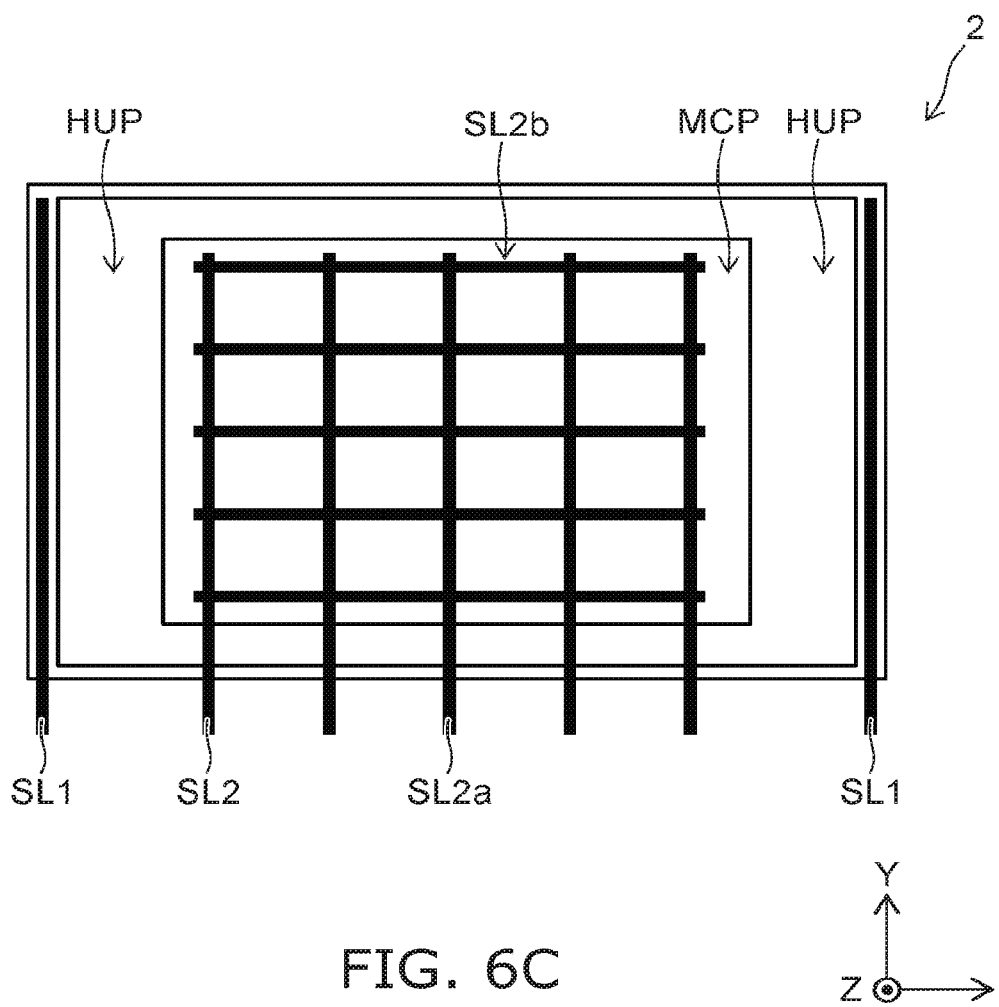

Hereinafter, a semiconductor memory device 2 according to another variation of the embodiment is described with reference to FIGS. 6A to 6C. FIG. 6A is a schematic view showing a cross-section of a memory cell part MCP taken along C-C line shown in FIG. 6B. FIG. 6B is a schematic view showing a cross-section taken along B-B line shown in FIG. 6A. FIG. 6C is a schematic plan view showing source lines SL1 and SL2 provided above the stacked body 100.

Also in this example, the metal layer 30 is provided between the source layer 20 and the stacked body 100 as shown in FIG. 6A. The contact plug Csb is further formed, which extends through the insulating layer 60 in the Z-direction. The contact plug Csb is electrically connected to the source layer 20 at a bottom end thereof. Moreover, the contact plug Csb is electrically connected at a top end thereof to the source line SL2 which is provided above the stacked body 100 (see FIG. 6C).

As shown in FIG. 6B, the contact plug Csb is provided, for example, with a columnar shape having a circular cross-section. The contact plug Csb is provided in the memory cell part MCP at a position close to the stacked body 100. Thereby, it is possible to apply uniform bias voltages to semiconductor layers 70 of the columnar bodies CL respectively through the source line SL2, the contact plug Csb and the source layer 20 by making a distance between a contact plug Cs and a columnar body CL short.

As shown in FIG. 6C, the semiconductor memory device 2 includes the source line SL and the source line SL2. The source line SL1 is electrically connected to the contact plug Csa that is provided at a position away from the memory cell part. The source line SL2 is electrically connected to the contact plug Csb that is provided in the memory cell part MCP.

The source line SL2 shown in FIG. 6C includes a first portion SL2a and a second portion SL2b. The first portion SL2a extends in the Y-direction, and the second portion SL2b extends in the X-direction. The first portion SL2a and the second portion SL2b are crossed in a mesh structure above the memory cell part MCP. The second portion SL2b is provided, for example, above the insulating layer 60 that extends along the slit space ST, and is electrically connected to the contact plug Csb.

In the semiconductor memory device 2, it is possible to apply uniform bias voltages to the semiconductor layers 70 in the columnar bodies CL by a combination of the source line SL1 and the source line SL2. Moreover, it is possible in the memory cell part MCP to make a contact plug Csb of small size and to reduce the number thereof by providing both the contact plug Csa and the contact plug Csb. Thereby, it becomes possible to reduce a distance between the adjacent stacked bodies 100, and thus, to enlarge the memory capacity in the semiconductor memory device 2.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modification as would fall within the scope and spirit of the inventions.

What is claimed is:

1. A semiconductor memory device, the device comprising:
   a first semiconductor layer;
   a stacked body including a plurality of electrode layers stacked in a first direction;
   a metal layer provided in the first direction between the first semiconductor layer and the stacked body; and
   a second semiconductor layer extending in the first direction through the stacked body and the metal layer, and being electrically connected to the first semiconductor layer, wherein
   the first semiconductor layer has a first conductive type, and
   the first semiconductor layer includes a first portion and a second portion, the second portion being positioned between the first portion and the metal layer, and having a first conductive type impurity concentration higher than a first conductive type impurity concentration in the first portion.

2. The device according to claim 1, wherein the second portion includes a material different form a material of the first portion.

3. The device according to claim 1, wherein the second semiconductor layer includes a material same as a material of the first semiconductor layer.

4. The device according to claim 1, further comprising:
a first insulating layer extending along the second semiconductor layer in the first direction, the first insulating layer being positioned between each of the plurality of electrode layers and the second semiconductor layer, and between the metal layer and the second semiconductor layer.

5. The device according to claim 4, wherein
the plurality of electrode layers includes a first electrode layer and a second electrode layer positioned between the metal layer and the first electrode layer, and
the first insulating layer includes a first portion positioned between the first electrode layer and the second semiconductor layer, the first portion including a charge storage part.

6. The device according to claim 5, wherein
the first insulating layer further includes a second portion and a third portion, the second portion being positioned between the second electrode layer and the second semiconductor layer, and the third position being positioned between the metal layer and the second semiconductor layer, and
a periphery of the third portion is wider than a periphery of the second portion in a second direction along a surface of the metal layer facing the second electrode layer.

7. The device according to claim 5, further comprising:
a first contact plug electrically connected to the first electrode layer;
a second contact plug electrically connected to the second electrode layer; and
a third contact plug electrically connected to the metal layer,
the second contact plug being positioned between the first contact plug and the third contact plug.

8. The device according to claim 7, further comprising:
a plurality of stacked bodies including the stacked body; and
a fourth contact plug electrically connected to the first semiconductor layer between adjacent stacked bodies of the plurality of stacked bodies.

9. The device according to claim 1, wherein the metal layer includes tungsten.

10. A method for manufacturing the semiconductor memory device according to claim 1, the method comprising:
forming the metal layer on the first semiconductor layer of a first conductive type;
forming a stacked film including first layers and second layers, the first layers and the second layers being alternately stacked on the metal layer;
forming a memory hole from a top surface of the stacked film to the metal layer;
exposing the first semiconductor layer by selectively removing the metal layer at a bottom surface of the memory hole;
forming a first insulating layer covering an inner wall of the memory hole; and
forming the second semiconductor layer covering the first insulating layer in the memory hole, and electrically connected to the first semiconductor layer.

11. The method according to claim 10, further comprising:
ion-implanting impurities of the first conductive type into the first semiconductor layer on a top surface side of the first semiconductor layer, the metal layer being in contact with a top surface of the first semiconductor layer.

12. The method according to claim 10, further comprising:
widening a bottom portion of the memory hole in a direction along a surface of the first semiconductor layer by removing a part of the metal layer.

13. The method according to claim 10, further comprising:
dividing the stacked film into a plurality of parts by forming a slit space from the top surface of the stacked film to the metal layer;
selectively removing the first layers via the slit space; and
forming the electrode layers in spaces formed by removing the first layers via the slit space.

14. A semiconductor memory device, the device comprising:
a first semiconductor layer;
a stacked body including a plurality of electrode layers stacked in a first direction, the plurality of electrode layers including a first electrode layer and a second electrode layer;
a metal layer provided in the first direction between the first semiconductor layer and the stacked body, the second electrode layer being positioned between the metal layer and the first electrode layer;
a second semiconductor layer extending in the first direction through the stacked body and the metal layer, and being electrically connected to the first semiconductor layer;
a first insulating layer extending along the second semiconductor layer in the first direction, the first insulating layer being positioned between each of the plurality of electrode layers and the second semiconductor layer, and between the metal layer and the second semiconductor layer, and the first insulating layer including a first portion positioned between the first electrode layer and the second semiconductor layer, the first portion including a charge storage part;
a first contact plug electrically connected to the first electrode layer;
a second contact plug electrically connected to the second electrode layer; and
a third contact plug electrically connected to the metal layer, the second contact plug being positioned between the first contact plug and the third contact plug.

15. The device according to claim 14, further comprising:
a plurality of stacked bodies including the stacked body; and
a fourth contact plug electrically connected to the first semiconductor layer between adjacent stacked bodies of the plurality of stacked bodies.

16. A method for manufacturing a semiconductor memory device, the method comprising:
forming a metal layer on a first semiconductor layer of a first conductive type;
forming a stacked film including first layers and second layers, the first layers and the second layers being alternately stacked on the metal layer;
forming a memory hole from a top surface of the stacked film to the metal layer;
exposing the first semiconductor layer by selectively removing the metal layer at a bottom surface of the memory hole;
widening a bottom portion of the memory hole in a direction along a surface of the first semiconductor layer by removing a part of the metal layer;

forming a first insulating layer covering an inner wall of the memory hole; and forming a second semiconductor layer covering the first insulating layer in the memory hole, and electrically connected to the first semiconductor layer.

17. The method according to claim 16, further comprising:

ion-implanting impurities of the first conductive type into the first semiconductor layer on a top surface side of the first semiconductor layer, the metal layer being in contact with a top surface of the first semiconductor layer.

18. The method according to claim 10, further comprising:

dividing the stacked film into a plurality of parts by forming a slit space from the top surface of the stacked film to the metal layer;

selectively removing the first layers via the slit space; and forming the electrode layers in spaces formed by removing the first layers via the slit space.

* * * * *